(12) United States Patent
Naruse

(10) Patent No.: US 7,292,453 B2
(45) Date of Patent: Nov. 6, 2007

(54) BI-FOLD MOUNTED PRINTED WIRING BOARD

(75) Inventor: Kentarou Naruse, Osaka (JP)

(73) Assignee: Kyocera Mita Corporation, Osaka (JP)

( * ) Notice: Subject to any disclaimer, the term of this patent is extended or adjusted under 35 U.S.C. 154(b) by 221 days.

(21) Appl. No.: 10/963,600

(22) Filed: Oct. 14, 2004

(65) Prior Publication Data

US 2006/0082985 A1    Apr. 20, 2006

(51) Int. Cl.
*H05K 1/11* (2006.01)
(52) U.S. Cl. ............... 361/784; 361/786; 361/787; 361/803
(58) Field of Classification Search ........... 361/749, 361/751, 786–787, 789, 784; 174/254, 52.1
See application file for complete search history.

(56) References Cited

U.S. PATENT DOCUMENTS 5,204,806 A * 4/1993 Sasaki et al. ............ 361/749
6,870,096 B2 * 3/2005 Suzuki et al. ............ 174/50
6,927,344 B1 * 8/2005 Gall et al. ................ 174/254
7,023,290 B2 * 4/2006 Kubo et al. .............. 331/158
7,079,119 B2 * 7/2006 Hanson et al. ........... 345/175

FOREIGN PATENT DOCUMENTS

JP          2003-8956 A      1/2003

* cited by examiner

*Primary Examiner*—Dean A. Reichard
*Assistant Examiner*—Abiy Getachew
(74) *Attorney, Agent, or Firm*—Global IP Counselors, LLP

(57) ABSTRACT

A mounted printed wiring board is disclosed that will allow sensors to be installed in optimal positions thereon with the same time and effort needed for one board, and allow the same to be inexpensively manufactured with a simple process. A single board unit includes first and second board portions having a break line interposed therebetween. Sensors and mounted components that are shorter than the sensors are mounted on the first board portion, connectors and mounted components that are taller than the sensors are mounted on the second board portion, and jumper wires are mounted across the first and second board portions. The board unit is then folded in two with the break line so that the mounting surfaces face outward, and the first and second board portions are fixed with spacers.

4 Claims, 6 Drawing Sheets

BI-FOLD MOUNTED PRINTED WIRING BOARD

BACKGROUND OF THE INVENTION

1. Field of the Invention

The present invention relates to a bi-fold mounted printed wiring board.

2. Background Information

A mounted printed wiring board on which for example light sensors are mounted is employed in an electronic image forming device in order to detect paper that is transported by a paper transport device. In addition to the light sensors, mounted components whose heights from the mounting surface are taller than those of the light sensors must also be mounted on the printed wiring board.

The light sensors must be disposed within a predetermined distance from the paper transport path in order to attain a predetermined detection accuracy. However, when there are mounted components on the mounted printed wiring board whose heights are taller than those of the light sensors, the tall mounted components will become obstacles, and thus the light sensors cannot be placed at a distance from the paper transport path that is optimal for paper detection.

In order to solve this problem, the light sensors can be installed close to the paper transport path without being mounted on the mounted printed wiring board.

In addition, it is also possible to solve this problem by employing a two sided mounted printed wiring board in which some or all of the mounted components having heights that are the same as or lower than those of the light sensors are mounted on one side of the mounted printed wiring board, and the remaining mounted components (including those having heights that are higher than those of the light sensors and the connectors) are mounted on the opposite side of the mounted printed wiring board.

Furthermore, the aforementioned problem can be solved by means of the method disclosed in Japanese Unexamined Patent Publication 2003-8956, in which a board on which some or all of the mounted components having heights that are the same as or smaller than those of the light sensors are mounted on one side thereof, and a board on which the remaining mounted components (including those having heights that are taller than those of the light sensors and the connectors) are mounted on the opposite side, are connected together with a flexible substrate, folded at the location of the flexible substrate, and then assembled.

However, with the method in which the light sensors are installed in a device separately from the board, a great deal of time and effort will be needed for installation.

In addition, with the method in which a two sided mounted printed wiring board is employed, the process of mounting the components is complex, and thus manufacturing costs will increase.

Furthermore, with the method in which the board is divided into two, connected together with a flexible substrate, and has mounted components such as light sensors and the like mounted thereon, a great deal of time and effort will be needed during installation because the two boards must be fixed to the device, and it will be quite difficult to lower costs because expensive components such as a flexible substrate are employed.

An object of the present invention is to provide a mounted printed wiring board that will solve the problems with the prior art, that will allow sensors to be installed in optimal positions thereon with the same time and effort needed to install one board, and allow the same to be inexpensively manufactured with a simple process.

SUMMARY OF THE INVENTION

In order to achieve this object, the technical means noted below are adopted in the mounted printed wiring board of the present invention.

First, the mounted printed circuit board of the present invention includes a board unit, jumper wires, and spacers.

The board unit includes first and second board portions that form a single continuous sheet, and after the mounted components and jumper wires are mounted on one side thereof, that one side, i.e., the mounting surface, is folded in two so as to face outward.

Generally speaking, jumper wires are considered to be mounted components, however in the present invention, the jumper wires have, in addition to an electrical function such as electrically connecting circuits, a structural mechanical function that links the first and second board portions after the board unit is folded in two until the first and second board portions are mounted to each other with the spacers, and are thereby distinguished from the other mounted components.

The jumper wires are mounted across one side of the first and second board portions in order to connect the circuits respectively formed on the first and second board portions.

The spacers link across a predetermined gap the first board portion and the second board portion that are connected by the jumper wires, when the one side on which the mounted components and the jumper wires are mounted is folded in two and separated so as to face outward.

In the present invention, the sensors include non-contact type sensors such as light sensors, magnetic sensors, and the like, switches such as lead switches (proximity switches) and the like, and contact points and the like.

In the present invention, the sensors, and some or all of the mounted components whose heights are equal to or smaller than those of the sensors, are mounted on the first board portion. However, because a space that is larger than the heights of the sensors will be needed in order to connect the connectors to their counterpart connectors, it is preferable that the connectors not be mounted on the first board portion even if the connectors have heights that are smaller than those of the sensors.

The remaining mounted components (of the mounted components that are mounted on the board unit) that are not mounted on the first board portion, and the mounted components that are taller than the sensors, are mounted on the second board portion.

With the present invention configured as described above, only the mounted components having heights that are the same as or smaller than those of the sensors will be mounted on the first board portion, and the mounted components having heights that are taller than those of the sensors will be mounted on the second board portion. Then, because the mounting surface of the first board portion and the mounting surface of the second board portion will mutually face outward by folding the board unit into two, the sensors that are mounted on the first board portion can be disposed in optimal positions that will either be near or in contact with another object without being obstructed by the mounted components that are taller than the sensors.

In addition, the present invention can be inexpensively manufactured with a simple process, in which after the sensors, the mounted components, and the jumper wires are mounted on one side of a single board unit, the board unit is folded in two and separated into the first and second board portions, and the separated first and second board portions are fixed together with spacers.

Furthermore, because the first and second board portions of the present invention are fixed together with the spacers, and the circuits that are formed thereon are connected with the jumper wires, the board of the present invention can be installed in a device with the same time and effort needed to install a single board.

In addition, in the present invention, the jumper wires may be configured so as to wrap around the edges of the first and second board portions. However, with this configuration, it will be necessary to mount the jumper wires so that they are raised from the surface of the single board unit, which may not only be technically difficult, but may also lengthen the jumper wires, and thus the jumper wires may catch on another object and be pulled out or torn off from the board unit.

Accordingly, in the present invention, it is preferable to adopt a configuration in which two cut-outs are formed in the board unit along each respective jumper wire mounted across the first board portion and the second board portion when one continuous sheet, and which respectively continuously extend from the boundary of the first board portion and the second board portion in a length that is longer than one half the length of a gap between the separated sides of the first board portion and the second board portion maintained by the spacers.

With this configuration, the jumper wires can be mounted near the board unit, and thus the jumper wires can be easily mounted, and the length of the jumper wires can be shortened. In addition, because the board unit is folded in two, and the jumper wires pass through the cut-outs of the first and second board portions when the first and second board portions are fixed together with the spacers, the jumper wires can be prevented from catching on another object and being pulled out or torn off during storage or installation.

Of course, although the type of circuits that are printed on the mounted printed wiring board of the present invention are not particularly limited, a configuration can be adopted in which, for example, the printed wiring of a paper detection circuit disposed along a paper transport path for electronic image formation is formed on the board unit, and the one side of the first board portion or the second board portion on which light sensors that detect paper, and mounted components whose heights are lower than those of the light sensors, are mounted is disposed to face the paper transport path.

With this configuration, by mounting the mounted components having heights that are taller than the light sensors on the board portion that is on the opposite side of the board portion that faces the paper transport path, the light sensors can be brought close to the paper transport path, and accurate paper detection can be performed.

As described above, according to the present invention, only the sensors and the mounted components that are shorter than the sensors are mounted on the first board portion that faces another object, and thus they will not be obstructed by the mounted components that are taller than the heights of sensors from the board unit, the sensors can be disposed near other objects, and for example sensors such as light sensors or magnetic sensors can be installed in optimal locations thereon.

In addition, the present invention can be inexpensively manufactured with a simple process in which the mounted components (including the jumper wires) are mounted on one side of the board unit, the board unit is folded in two to separate it into the first and second board portions, and the first and second board portions are linked together with the spacers.

Furthermore, because the first board portion and the second board portion are linked together with the spacers and the jumper wires, the first and second board portions can be installed in a device with the same time and effort needed to install one board unit, and thus the work efficiency of the installation can be improved.

These and other objects, features, aspects and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Figure 1:
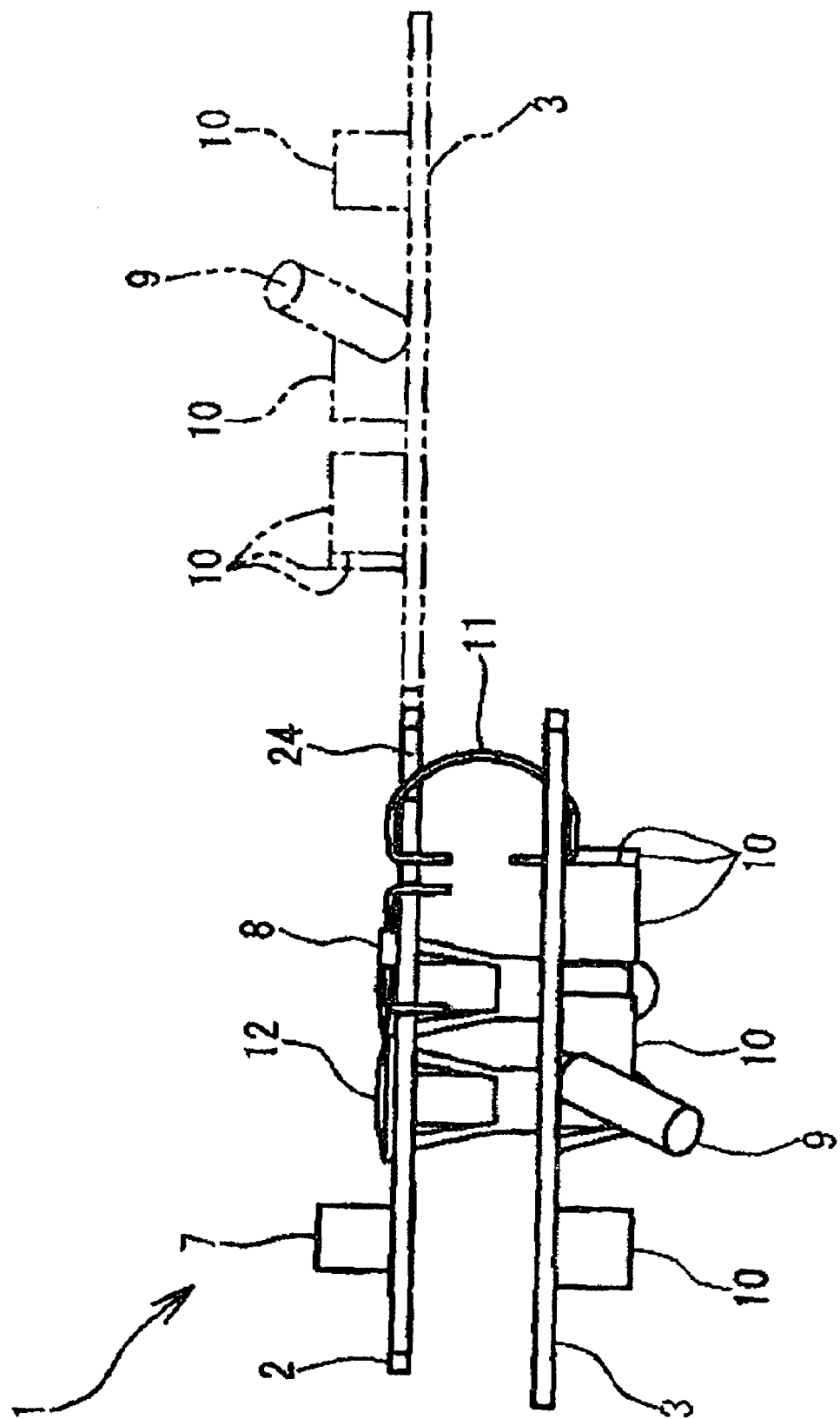
FIG. 1 is a lateral view of the present invention.
Figure 2:
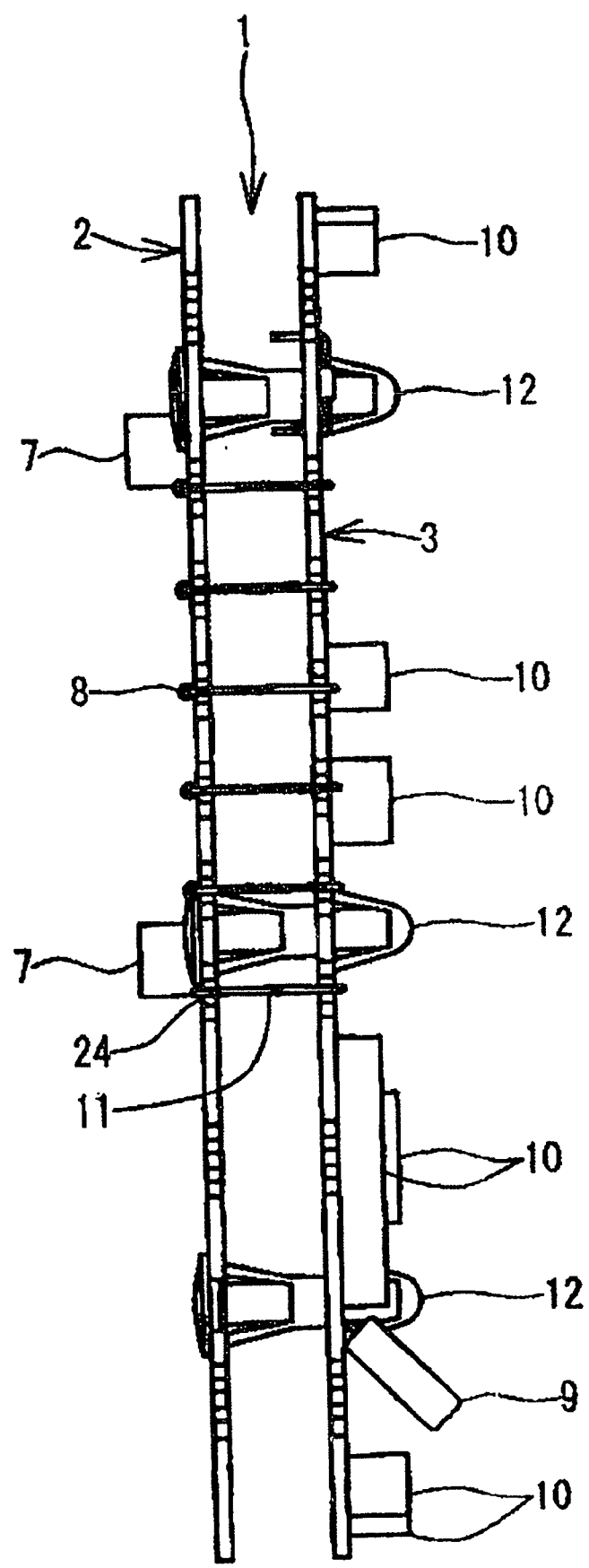
FIG. 2 is a front view of the present invention.

A bi-fold mounted printed wiring board according to an embodiment of the present invention will be described in detail based upon the figures. FIG. 1 is a lateral view, FIG. 2 is a front view, and FIG. 3 is a plan view of the present invention prior to folding.

Figure 3:
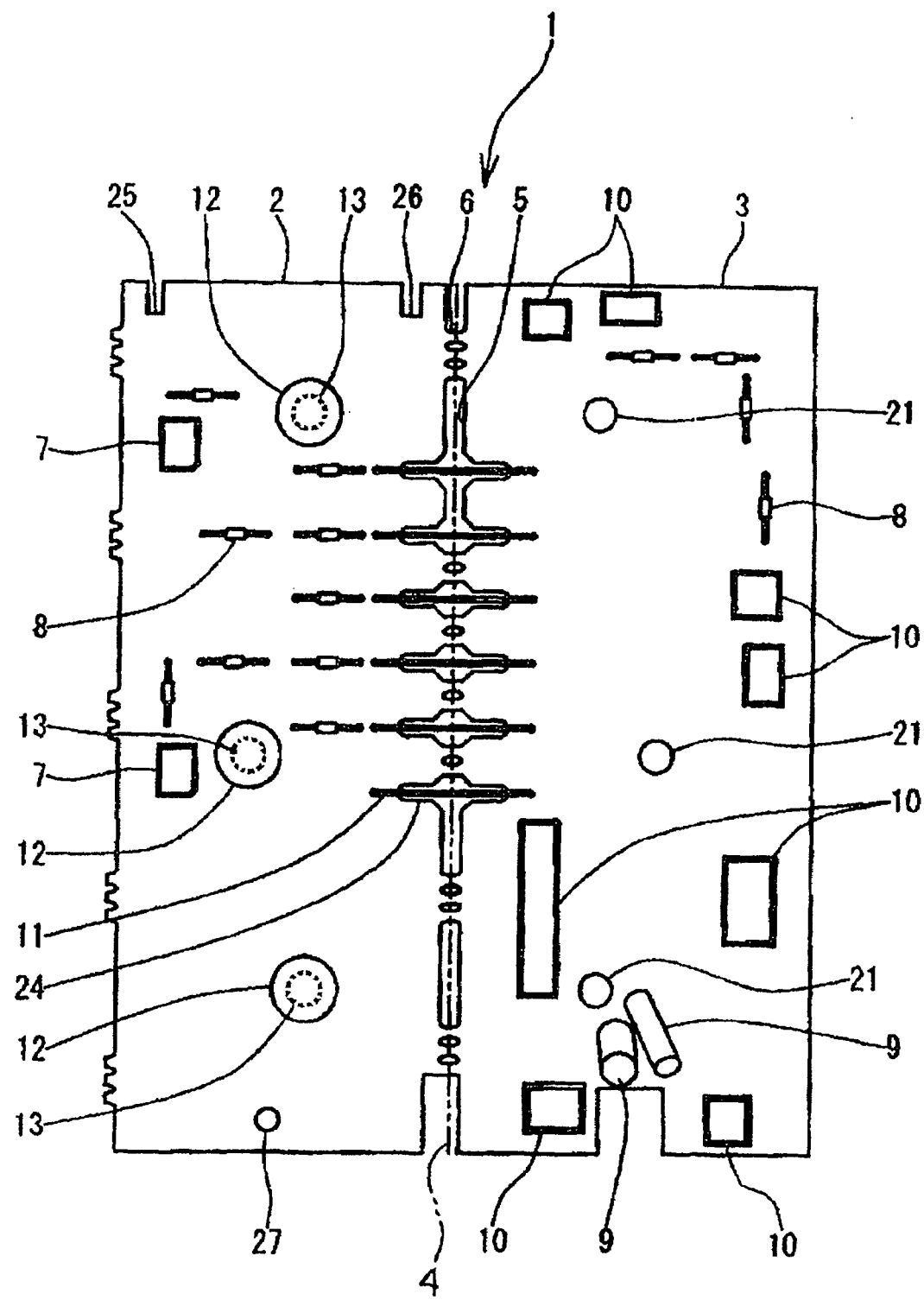
FIG. 3 is a plan view of a board unit of the present invention.

As shown in FIG. 3, the bi-fold mounted printed wiring board includes one board unit 1, and this board unit 1 includes a first board portion 2, a second board portion 3, and a break line 4 arranged on the boundary between the first and second board portions 2, 3.

A slit 5 is intermittently formed along the break line 4 in the board unit 1, and the first and second board portions 2, 3 are linked together via bridges 6 that are appropriately arranged on the board unit 1.

Light sensors 7, and mounted components 8 (such as axial lead type components) that are shorter than the light sensors 7, are mounted on the first board portion 2, and mounted components 9 (such as axial lead type components)(a portion thereof not shown in the figures) that are taller than the light sensors 7, connectors 10, and mounted components 8 (a portion thereof not shown in the figures) that are shorter than the light sensors 7, are mounted on the second board portion 3. In addition, jumper wires 1 (6 for example) that connect the printed wiring formed across the first and second board portions 2, 3 are mounted inside the board portions 2, 3.

The light sensors 7, the mounted components 8 that are shorter than the light sensors 7, the mounted components 9 that are taller than the light sensors 7, the connectors 10, and the jumper wires 11 are mounted on one side of the first board portion 2 and the second board portion 3.

Insertion holes 13 in which spacers 12 are inserted are formed in three locations in the first board portion 2 and suitably spaced apart in the planar direction, and spacers 12 made of a synthetic resin are inserted into each insertion hole 13 after the mounting process.

Figure 4:
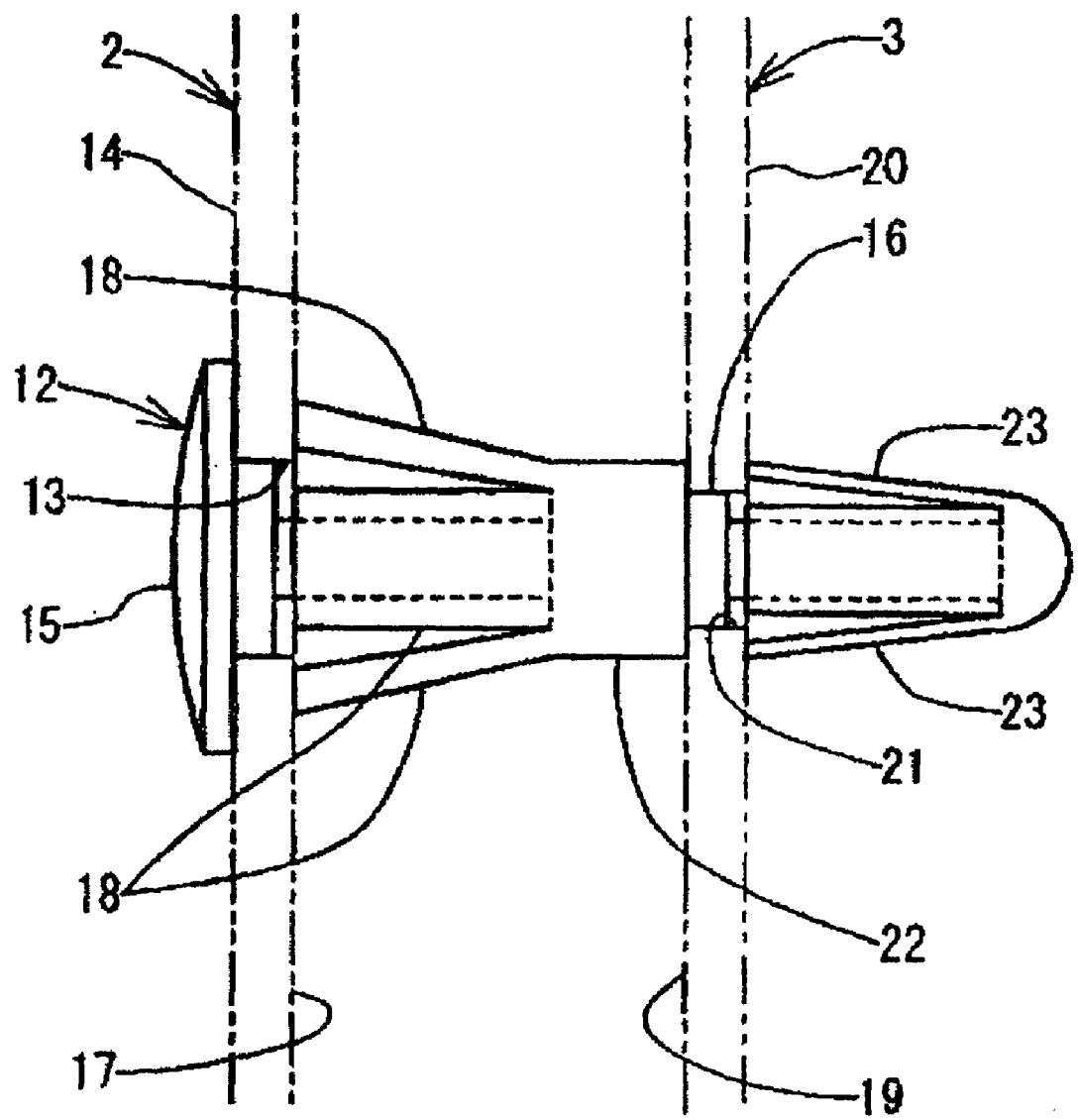
FIG. 4 is a lateral view of a spacer of the present invention.
Figure 5:
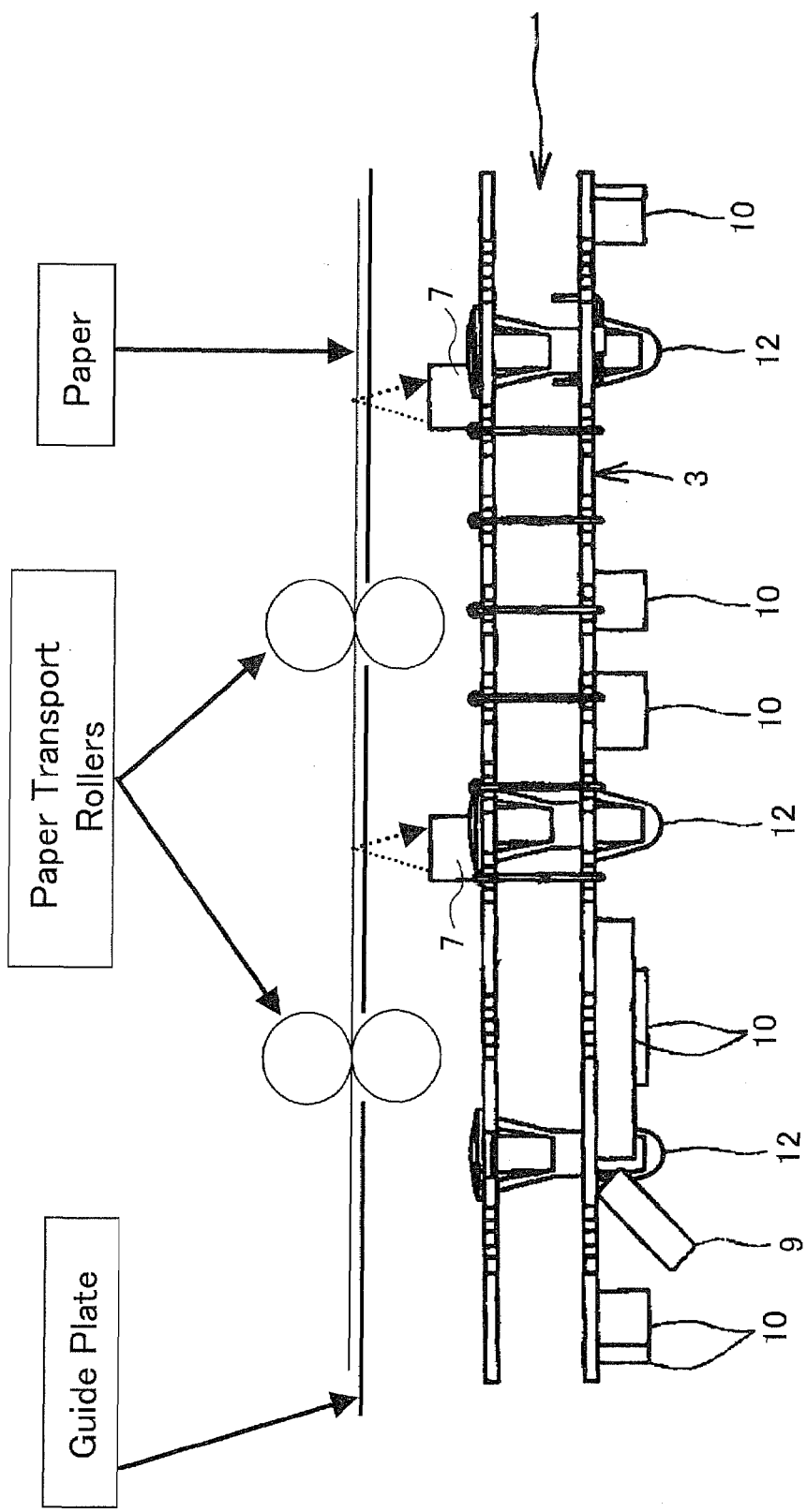
Figure 6:
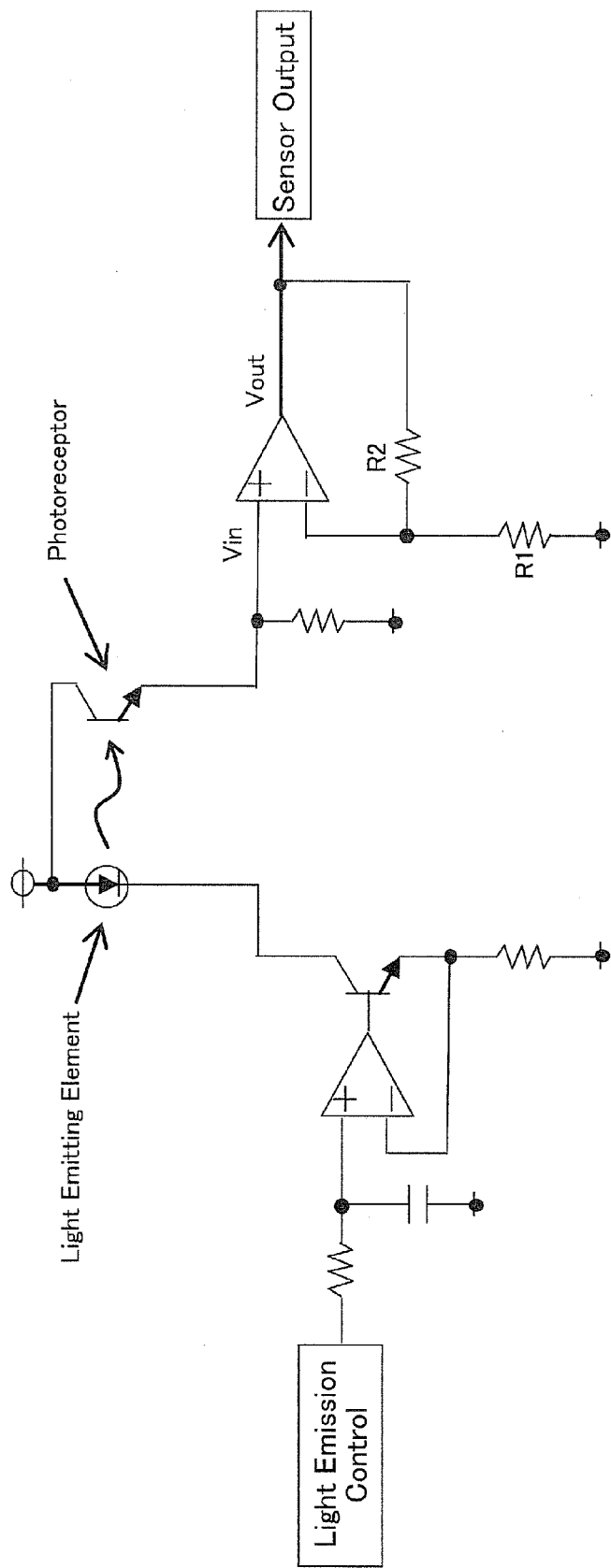

FIG. 4 is a lateral view of a spacer 12.

As shown in FIG. 4, a head 15 is arranged on one end of the spacer 12 and is placed in contact with a mounting surface 14 of the first board portion 2. A lock 18 is formed on the base end portion of a shaft 16 that extends from the central portion of the head 15, is inserted into the insertion hole 13 from the mounting surface 14, and will elastically deform. When the head 15 comes into contact with the mounting surface 14, the lock 18 will pass through the insertion hole 13, expand due to its elasticity, and will come into contact with a solder surface 17 of the first board portion 2.

Then, by interposing the first board portion 2 between the head 15 and the lock 18, one end of the spacer 12 will be fixed to the first board portion 2.

After each spacer 12 is mounted on the first board portion 2, when the board unit 1 is folded at the break line 4 so that the solder surfaces 17, 19 of the first and second board portions 2, 3 face toward each other and the mounting surfaces 14, 20 face away from each other, the stress will be concentrated on the bridges 6, and the first and second board portions 2, 3 will be simply broken at the bridges 6. However, the broken first and second board portions 2, 3 will still be connected by the jumper wires 11.

Insertion holes 21 in which the tip portion of the shafts 16 of the spacers 12 are inserted are formed in positions on the second board portion 3 which correspond to the insertion holes 13 of the first board portion 2. A seat 22 that receives the solder surface 19 around the periphery of the insertion holes 21, and a separate lock 23 that is elastically deformable and that can pass through the insertion holes 13 of the first board portion 2 and the insertion holes 21 of the second board portion 3, are formed on the tip portions of the shafts 16.

The lock 23 will pass through the insertion hole 21 when the seat 22 comes into contact with the solder surface 19, will elastically expand, and will come into contact with the mounting surface 20 of the second board portion 3. Then, by continuously breaking the board unit 1 into two and inserting the tip portion of the shaft 16 of the spacer 12 in the insertion hole 21, and causing the second board portion 3 to be interposed between the seat 22 and the lock 23, the second board portion 3 will be fixed to the tip portion of the spacer 12 with a short series of operations that can almost be considered a one touch operation.

Note that by fixing the spacers 12 to the first and second board portions 2, 3 at three locations, the first and second board portions 2, 3 will be maintained in a mutually parallel position across a predetermined gap.

As shown in FIG. 3, cut-outs 24 are formed in the board unit 1 along each respective jumper wire 11 mounted across the first board portion 2 and the second board portion 3 when one continuous sheet, are continuous with other cut-outs 24, and extend from the boundary of the first and second board portions 2, 3, e.g., the slit 5, in a length that is longer than one half the length of a gap between the broken edges (the separated bridges 6) of the first and second board portions 2, 3 maintained by the spacers 12. Note that this gap can also be referred to as the gap between the first and second board portions 2, 3 because the first and second board portions 2, 3 are parallel.

With this configuration, the jumper wires 11 can be mounted near the board unit 1, and thus the jumper wires 11 can be easily mounted, and the length of the jumper wires 11 can be shortened.

In addition, because the board unit 1 is folded in two, and the jumper wires 11 pass through the cut-outs 24 of the first and second board portions 2, 3 when the first and second board portions 2, 3 are fixed with the spacers 12, the jumper wires 11 can be prevented from catching on another object and being pulled out or torn off during storage or assembly.

Note also that cut-outs 25, 26 in which engagement portions provided on the device are inserted, and a screw hole 27 in which a screw to be fixed to the device is inserted, are also formed in the first board portion 2.

As described above, with this bi-fold mounted printed wiring board, only the light sensors 7, and the mounted components 8 that are shorter than the light sensors 7, are mounted on the first board portion 2 that faces another object, e.g., the paper of an electronic image forming device, and thus they will not be obstructed by the mounted components 9 and the connectors 10 arranged on the board unit 1 that are taller than the light sensors 7, and thus the light sensors 7 can be installed in optimal locations near the paper.

In addition, this bi-fold mounted printed wiring board can be inexpensively manufactured with a simple process in which the light sensors 7, the connectors 10, the jumper wires 11, and the mounted components 8, 9 are mounted on one side of the board unit 11, the board unit 1 is folded in two to separate it into the first and second board portions 2, 3, and the first and second board portions 2, 3 are linked together with the spacers 12.

Furthermore, because the first board portion 2 and the second board portion 3 are linked together with the spacers 12 and the jumper wires 11, the first and second board portions 2, 3 can be installed in a device with the same time and effort needed to assemble one board unit 1, and thus the work efficiency of the installation can be improved.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing description of the embodiments according to the present invention are provided for illustration only, and not for the purpose of limiting the invention as defined by the appended claims and their equivalents.

What is claimed is:

1. A bi-fold mounted printed wiring board, comprising:
   a board unit including a first board portion and a second board portion, the board unit having mounted components and one or more sensors mounted on a same side of the board unit when the first board portion and the second board portion are configured as a continuous single sheet;
   jumper wires which are mounted across the one side of the first and second board portions and connect circuits respectively formed on the first and second board portions; and
   a plurality of spacers configured to link the first board portion and the second board portion across a predetermined gap and arranged so that a mounting surface of the first board portion and a mounting surface of the second board portion face away from each other when the first board portion and the second board portion are separated,
   one or more of the mounted components having heights that are equal to or smaller than heights of the one or more sensors being mounted on the mounting surface of the first board portion, and one or more of the mounted components having heights that are taller than the heights of the one or more sensors being mounted on the mounting surface of the second board portion.

2. The bi-fold mounted printed wiring board set forth in claim 1, wherein
   a break line is formed in the board unit, the break line making the first board portion and the second board portion intermittently continuous in a boundary between the first board portion and the second board portion when the board unit is one continuous single sheet, and allowing the board unit to be separated.

3. The bi-fold mounted printed wiring board set forth in claim 1, wherein
   a plurality of cut-outs are formed in the board unit so as to extend along a respective jumper wire mounted across the first board portion and the second board portion when one continuous single sheet, and which respectively continuously extend from the boundary of the first board portion and the second board portion in a length that is longer than one half the length of the predetermined gap between the separated first board portion and the second board portion maintained by the spacers.

4. The bi-fold mounted printed wiring board set forth in claim 1, wherein
   the circuits are configured for electronic image formation, and the one or more sensors include one or more light sensors configured and arranged to detect a presence of paper.

* * * * *